United States Patent [19]

Masuoka et al.

[11] 4,115,795

[45] Sep. 19, 1978

[54] SEMICONDUCTOR MEMORY DEVICE

[75] Inventors: Fujio Masuoka; Hisakazu Iizuka, both of Yokohama, Japan

[73] Assignee: Tokyo Shibaura Electric Co., Ltd., Tokyo, Japan

[21] Appl. No.: 754,693

[22] Filed: Dec. 27, 1976

[30] Foreign Application Priority Data

Dec. 26, 1975 [JP] Japan .................. 50/154769

[51] Int. Cl.² ........................... H01L 27/10
[52] U.S. Cl. ........................ 357/24; 357/23; 357/41; 357/51; 357/71; 365/186
[58] Field of Search ............. 357/23, 51, 24, 59, 357/41, 45, 71; 340/173 R, 173 CA; 365/174, 182, 186

[56] References Cited
U.S. PATENT DOCUMENTS 4,012,757   3/1977   Koo ............................ 357/41

*Primary Examiner*—Stanley D. Miller, Jr.
*Assistant Examiner*—James W. Davie
*Attorney, Agent, or Firm*—Finnegan, Henderson, Farabow & Garrett

[57] ABSTRACT

A memory is formed by a first insulating layer provided on a part of the surface of a semiconductor substrate of a first conductivity type, a first electrode provided on the first insulating layer and a surface region which serves as an electrode on the semiconductor substrate facing the first electrode. A semiconductor region of a second conductivity type is formed in the semiconductor substrate spaced from the surface electrode of the substrate, for providing a connection thereof to a digit line. A second electrode is provided between the second conductivity type semiconductor region and the surface region which serves as an electrode of the semiconductor substrate via a second insulating layer. The second electrode extends over a third insulating layer provided on the first electrode, and the extended portion of the second electrode is provided with an electrode secured thereto for providing a connection of the second electrode to an address selection line.

8 Claims, 7 Drawing Figures

4,115,795

SEMICONDUCTOR MEMORY DEVICE

BACKGROUND OF THE INVENTION

The present invention relates to a semiconductor memory device and, more particularly, to a dynamic memory device with a large capacity.

Semiconductor devices are known in which a unit memory device is comprised of a single transistor e.g. a MOS transistor, and a capacitive memory element interconnected to each other. Such known memory devices are of the type in which a semiconductor capacitive element is formed adjacent a signal MOS transistor and the writing and reading operations to and from the capacitive element are performed by controlling the gate voltage of the MOS transistor. However, in such type memory devices, the occupied area of the unit memory device on the semiconductor substrate is large. This prevents high density integration of the memory device. Another known memory device is of the type in which a capacitor electrode is formed on a part of the surface of a semiconductor substrate through an $SiO_2$ layer. The surface of the semiconductor substrate facing the capacitor electrode, and the $SiO_2$ layer are combined to form a semiconductive capacitive element, and the channel region of a MOS transistor (the semiconductor region between the source and drain of an ordinary MOS transistor) adjacent the capacitive element is directly coupled with the semiconductor substrate surface facing the capcitor electrode. A memory device of this kind is treated in the paper entitled "SURFACE CHARGE RAM SYSTEM" by W. E. Engeler, J. J. Tiemann and R. D. Baertsch, on pages 18 to 19 of DIGEST OF TECHNICAL PAPERS by 1972 IEEE International Solid-State Circuits Conference.

For memory arrays assembled in matrix fashion from a number of those memory elements, a high rate of reading and writing operation cycles is necessary. To this end, the occupied region of the individual memory element and the parasitic capacitance associated with an address selection line as well must be minimized. It was confirmed that, to satisfy those requirements, the address selection line must be connected with the gate electrode of the MOS transistor, over the storage electrode or the capacitor electrode.

Accordingly, an object of the present invention is to provide a semiconductor memory device in which the connection position of the gate electrode of a MOS transistor to an external conductor is so selected as to minimize the occupied region of a unit memory cell.

The present invention may be briefly summarized as involving a semiconductor memory device comprising: a semiconductor substrate of a first conductivity type; a memory element including a first insulating layer formed on a part of the surface of the substrate of the first conductivity type, a first electrode formed on the insulating layer and a surface region which serves as an electrode on the substrate facing the first electrode; a semiconductor region of a second conductivity type formed in the substrate spaced from the surface region of the substrate and connected to a first external conductor; a second insulating layer over the surface of the substrate between the semiconductor region of the second conductivity and the surface region of the substrate; a third insulating layer provided on the first electrode; a second electrode including first and second portions being continuous to each other, the first portion being disposed on the second insulating layer and the second portion on the third insulating layer; and an electrode contacting the second portion of the second electrode over the surface region and connected to a second external conductor.

Other features and objects of the present invention will be apparent from the following description taken in connection with the accompanying drawings, in which:

DETAILED DESCRIPTION OF THE PREFERRED EMBODIMENTS

Figure 1:
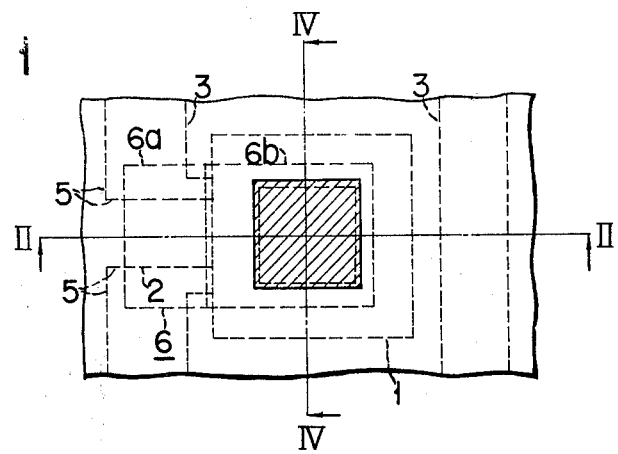
FIG. 1 shows a plan view of a portion of a semiconductor memory device according to the present invention.

In FIGS. 1 to 4, reference numeral 9 designates a semiconductor substrate of a first conductivity type, for example, a P-type silicon substrate with relatively high resistance. First and second silicon dioxide ($SiO_2$) insulating layers 1 and 2 each with the thickness, for example, of 1000A are formed on a portion of the surface of the substrate 9. The $SiO_2$ insulating layers 1 and 2 are integrally formed to a unity. The insulating layers 1 and 2 may be not only made of a single layer of $SiO_2$ but also of a single layer of $SiO_2$, silicon nitride ($Si_3N_4$) or aluminum oxide ($Al_2O_3$), or a combination of these layers. The insulating layer 1 is provided thereon with a first electrode 3 made of polycrystalline silicon. The first electrode 3 may be formed by the ordinary chemical vapour deposition (CVD) method. Molybdenum (Mo), tungsten (W) or aluminum (Al) may also be employed for the electrode 3. By impressing a positive voltage to the first electrode 3 and a negative voltage to the substrate 9, a N-type inversion layer 4 is formed on the surface region of the substrate 9 facing the electrode 3 via the insulating layer 1. In this case, the first electrode 3, the insulating layer 1 and the inversion layer 4 constitute a capacitor Cl to be used as a memory capacity for storing information therein.

A second conductivity type of $n^+$ region 5 is formed on the surface of the substrate 9 distanced from the N-type inversion layer 4 by a predetermined distance. The $n^{30}$ region 5 may be formed by the ordinary impurity diffusion method. The $n^+$ region 5 is connected to a first external conductor or a digit line. On the substrate surface between the inversion layer 4 and the $n^+$ region 5, a second insulating layer 2 of $SiO_2$ and with 1000A thickness is provided on which a second electrode 6 is further provided. The second electrode 6 includes a first portion 6a on the insulating layer 2, a second portion 6b on a third insulating layer 7 formed on the first electrode 3, and a third stepped portion 6C. Although the second electrode 6 is made of polycrystalline silicon in this example, metallic materials such as Mo, W or Al may also be employed for the second electrode 6. The $n^+$ region 5, the second insulating layer 2, the N-type inversion layer 4, and the second electrode 6 (gate electrode) constitute a single MOS transistor 8. When the third insulating layer 7 is made of the same material as of the first insulating layer 1, it is preferable that the third insulating layer is sufficiently thicker than the first one. In this example, 8000A is selected for the thickness of the third insulating layer 7, and $SiO_2$ for the material thereof. Further, it is desirable to determine the thickness of third insulating layer 7 by taking account of a capacity C2 to be formed between the second portion 6b of the second electrode 6 and the first electrode 3. More precisely, the thickness of the third insulating layer 7 is selected desirably so as to satisfy the condition $C_2 < C_3$ where $C_3$ is the capacitance formed between the first portion 6a of the second electrode 6 of the MOS transistor 8 and the substrate 9. Therefore, it is desirable that the third insulating layer 7 is made of the material of low dielectric constant.

The upper portion of the semiconductor memory cell of the present invention is covered with a protective insulating layer 10. The protective insulating layer 10 is provided with an opening 11 which reaches the second portion 6b of the second electrode 6 over the first electrode 3. An electrode 12 to be connected to a second external conductor, for example, an address selection line is secured onto the second portion 6b of the second electrode 6 through the opening 11. Although, in this example, the opening 11 is entirely positioned above the first electrode 3, it is satisfactory that the opening 11 be partly positioned on the second portion 6b over the first electrode 3. The reason why the relative position of the opening 11 to the second portion 6b is thus specified is that the region for memory capacitor formation must be as large as possible while at the same time the area of the semiconductor substrate which the entire of the semiconductor memory cell occupies must be small as possible. This is a very important feature of the present invention. With such a construction, the parasitic capacitance of a digit line (first external conductor) is small so that a sense amplifier connected to the digit line to be described later is improved in the sensitivity and the rate of reading and writing cycles of the information to the memory cell.

Figure 2:
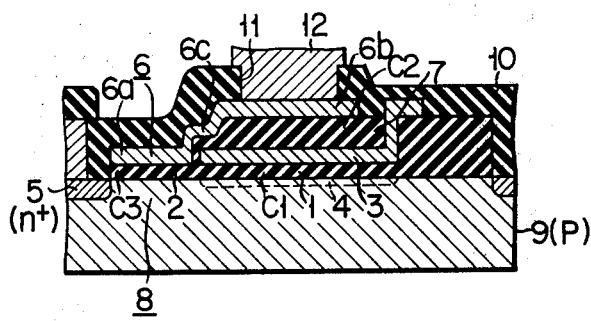
FIG. 2 shows a cross sectional view of the semiconductor memory device shown in FIG. 1, taken along the section line II—II.
Figure 3:
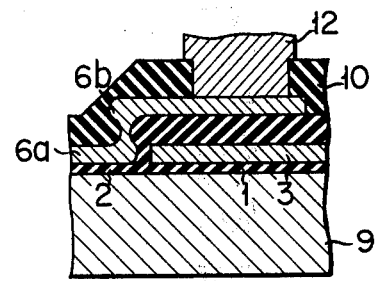
FIG. 3 illustrates a form in the fabrication of a part of the cross section shown in FIG. 2.
Figure 4:
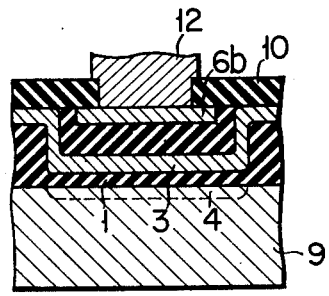
FIG. 4 shows a cross sectional view of a portion of the memory device of FIG. 1, taken along the section line IV—IV.

As seen from the drawing of FIG. 2, the third stepped portion 6c of the second electrode 6 connecting the first portion 6a and the second portion 6b is substantially parallel with the first and second portions 6a and 6c. Such a stepped portion is used to make easy the manufacturing of the semiconductor memory cell according to the present invention. More precisely, the first electrode 3 is deposited on the first insulating layer 1 by the CVD method and then the third insulating layer 7 is formed on the first electrode 3. After this, the surface of the substrate is exposed above which the first portion 6a of the gate electrode 6 of the MOS transistor 8 is to be disposed. Following this, the gate oxide film 2 is formed on the exposed surface of the substrate 9 by the thermal oxidation method. Using photoengraving process, the portion of the third insulating layer 7 adjacent the MOS transistor 8 is caused to be thinner than the other portion of the insulating layer 7. Under this condition, the second electrode 6 is formed so that the third portion of the second electrode 6 takes a stepped form as shown in FIG. 2. Otherwise, i.e. if the portion of the layer 7 adjacent the MOS transistor 8 is not thinned, the second electrode 6 formed thereover projects to form an undesirable overhang between the first and second portions 6a and 6b, as shown in FIG. 3.

Figure 5:
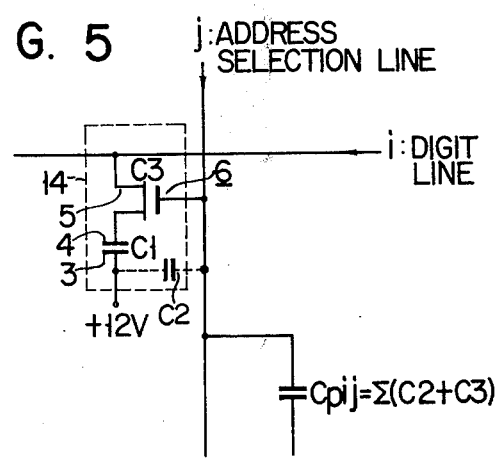
FIG. 5 shows a schematic circuit diagram of an equivalent circuit of a memory element of the memory device according to the present invention and its connection to the associated external conductors, the equivalent circuit being enclosed by a broken line.

The equivalent circuit of the memory cell of the present invention is shown in FIG. 5 and enclosed by a dotted line. As shown in FIG. 5, the gate electrode 6 is connected to the address selection line j via the electrode 12 (FIG. 2), and the $n^+$ region 5 to the digit line i. It is to be noted here that the capacitor C2 (between the first electrode 3 and the second electrode 6) and the one C3 (between the second electrode 6 and the semiconductor substrate 9) are attendant on the address selection line j. If a large number of memory cells are connected to a single address selection line j, the total parasitic capacitance related to the address selection line j is given by $C_{pij} = \Sigma(C2+C3)$. The selection line j is the one selected by a decoder circuit (not shown). In each addressing cycle, the voltage on the selection line j changes from 0 to 12V or vice versa. At the same time, the total capacity of $C_{pij}$ must be discharged and recharged. Accordingly, a large capacity of $C_{pij}$ results in a slow rate of the writing and reading operations and a large power dissipation. In other words, a small total capacitance of an address selection line causes the rate of reading and writing cycles and also the power dissipation to be improved.

Figure 6:
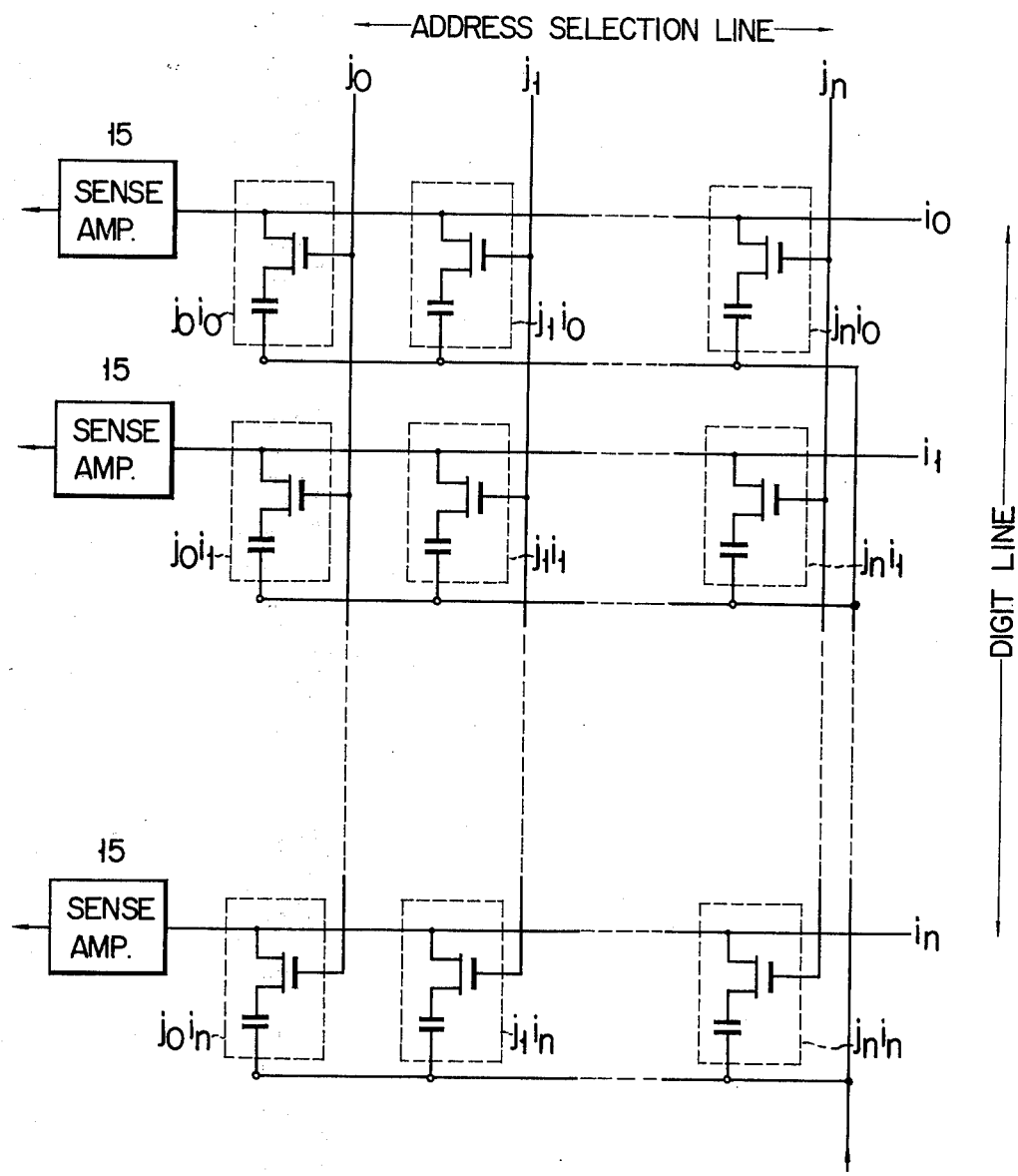
FIG. 6 shows a memory array of a plurality of memory elements according to the present invention.

Turning now to FIG. 6, there is shown a memory array consisting of a number of the memory cells of the present invention shown in FIG. 5. In the figure, the respective memory cells, represented by $j_0 i_0$ to $j_n i_n$ are each the same as the memory cell 14 shown in FIG. 5 in the construction. Sense amplifiers 15 are connected to the digit lines $i_0$ to $j_n$, respectively. The explanation follows of the case where information is written into or read out of the memory cell $j_0 i_0$. In those operations, −5V is applied to the substrate 9 and +12V to the first electrode 3, and thus free electrons are induced on the surface of the substrate 9 facing the first electrode 3, thereby forming the N-type inversion layer 4 thereon. When +12V is applied to the address selection line $j_0$, the gate electrode (the second electrode) 6 of the MOS transistor 8 becomes +12V so that the MOS transistor 8 is turned on. At this time, if desired data is fed from the digit line $i_0$, it is loaded into the memory capacitor C1. Then, when 0V is applied to the address selection line $j_0$, the MOS transistor 8 is turned off while the data stored in the memory capacitor C1 remains being stored. For reading the data stored out of the capacitor C1, +12V is again applied to the address selection line $j_0$. Applying voltage of 12V, the gate of the MOS transistor 8 is reselected to permit the data stored in the memory capacitor C1 to be read out of the capacitor through the sense amplifier 15.

In the above-mentioned case, the digit line $i_0$ is associated with a capacitor whose capacitance is much larger than the capacitance C1 of the memory cell. Therefore, when the stored information is read out of the memory cell, the charges from the memory capacitor C1 are shared by those from the capacitance parasitic to the digit line $i_0$. This is inclined to disturb the detection by the sense amplifier of the stored data in the memory capacitor C1. For avoiding this, it is desirable that the memory capacitance C1 of the memory cell is increased large compared with the total capacitance associated with the digit line i. In other words, with a fixed value of the memory cell capacitance C1, if the total stray capacitance of the digit line $i_o$ could be decreased small, the sensitivity of the sense amplifier 15 would be improved while at the same time the reading and writing cycle rate would be increased. It should be noted that, according to the present invention, the occupied area of the memory cell is small without making small the memory capacity C1, so that the memory device of the present invention may improve the sensitivity of the sense amplifier 15 and the rates of the reading and writing operation cycles.

Let us consider again the parasitic capacitance to the address selection line $j$ already referred to in the FIG. 5 description. As described previously, the capacitor C2 formed between the gate electrode (second electrode) 6 and the first electrode 3 is small and hence the parasitic capacitance $C_{pij}$ of the address selection line $i$ is small. For this, even if the driving power to drive the address selection line $j$ is small, the memory cell of the present invention is operable with a satisfactory reliability. It is also necessary to minimize as much as possible the signal transfer delay on the address selection line $j$. The signal transfer delay is determined by the time constant CR which is the multiplication of the distributed capacitance by the distributed resistance associated with the address selection line. The larger the time constant the larger the signal transfer delay and the high speed writing or reading operation becomes difficult. In the memory cell according to the present invention, the second electrode 6 can be connected with the aluminum terminal 12 over the first electrode 3 with a relatively large occupied area. Therefore, an aluminum address selection line $j$ with a small resistance may easily be used. As is recalled, the parasitic capacitance to the address selection line could be reduced. Thus, the time constant could be made small, resulting in improving the reading or writing speed.

Figure 7:
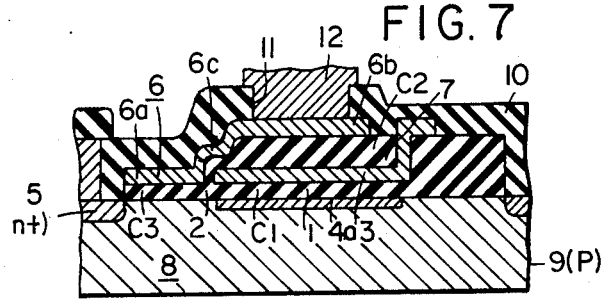
FIG. 7 shows a cross-sectional view of another embodiment of the semiconductor memory device shown in FIG. 1, taken along the line II—II.

Although the N-type inversion region 4 is formed by applying a positive voltage to the first electrode 3 in the heretofore described embodiment, it will be understood that a $n^+$ region 4a could be formed in advance on the surface region of the substrate where the inversion layer is to be formed as illustrated in FIG. 7. In this case, it is as a matter of course that there is no need for a constant application of the inversion voltage to the electrode 3. Further, the present invention likewise is applicable for the case when the first conductivity type is of N-type and the second one of P-type.

What we claim is:
1. A semiconductor memory device comprising:
 a semiconductor substrate of a first conductivity type;
 a capacitive memory element including a first insulating layer formed on a part of the surface of said substrate and a first electrode formed on said insulating layer, said first electrode serving as one capacitor electrode and said substrate serving as another capacitor electrode of said capacitive memory element;
 a semiconductor region of a second conductivity type formed in said substrate spaced from a surface region of said substrate facing said first electrode and said semiconductor region connected to a first external conductor;
 a second insulating layer provided on the surface of said substrate between the semiconductor region of said second conductivity type and said surface region of said substrate;
 a third insulating layer provided on said first electrode;
 a second electrode including first, second, and third portions, said first and second portions being connected to said third portion and said first portion being disposed on said second insulating layer and said second portion being disposed on said third insulating layer; and
 an electrode contacted with said second portion of said second electrode over said surface region of said substrate and connected to a second external conductor.

2. A semiconductor memory device according to claim 1, in which said first and second electrodes are made of polycrystalline silicon.

3. A semiconductor memory device according to claim 1, in which said third portion of said second electrode includes a section substantially parallel with said first and second portions and said third insulating layer between the lower surface of said third portion and the upper surface of said first electrode is thinner than said third insulating layer between the lower surface of said second portion and the upper surface of said first electrode.

4. A semiconductor memory device according to claim 1, in which the capacitance of a capacitor formed by said second portion of said second electrode, said first electrode and said third insulating layer is less than the capacitance of a capacitor formed by said first portion of said second electrode, the semiconductor substrate surface layer facing said first portion of said second electrode, and said second insulating layer.

5. A semiconductor memory device according to claim 1, in which the dielectric constant of said first and second insulating layers is greater than the dielectric constant of said third insulating layer.

6. A semiconductor memory device according to claim 1, in which said first, second and third insulating layers are made of silicon dioxide ($SiO_2$), said first and second insulating layers are equal in thickness, and the thickness of said third insulating layer is at least twice the thickness of said first and second insulating layers.

7. A semiconductor memory device according to claim 1, in which said semiconductor surface region is of the second conductivity type.

8. A semiconductor memory device according to claim 1, in which said first external conductor is a digit line and said second external conductor is an address selection line.

* * * * *